United States Patent
Tsutsumi et al.

(10) Patent No.: US 11,043,955 B2
(45) Date of Patent: Jun. 22, 2021

(54) PLL CIRCUIT

(71) Applicant: Mitsubishi Electric Corporation, Tokyo (JP)

(72) Inventors: Koji Tsutsumi, Tokyo (JP); Sho Ikeda, Tokyo (JP); Mitsuhiro Shimozawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/938,099

(22) Filed: Jul. 24, 2020

(65) Prior Publication Data
US 2020/0358448 A1    Nov. 12, 2020

Related U.S. Application Data

(63) Continuation of application No. PCT/JP2018/009265, filed on Mar. 9, 2018.

(51) Int. Cl.
*H03L 7/099* (2006.01)
*H03L 7/087* (2006.01)
*H03L 7/18* (2006.01)

(52) U.S. Cl.
CPC .............. *H03L 7/099* (2013.01); *H03L 7/087* (2013.01); *H03L 7/18* (2013.01)

(58) Field of Classification Search
USPC .................................................. 327/156–158
See application file for complete search history.

(56) References Cited

U.S. PATENT DOCUMENTS

| 5,856,761 | A | 1/1999 | Jokura | |
|---|---|---|---|---|
| 6,072,370 | A * | 6/2000 | Nakamura | H03L 7/087 327/156 |
| 8,222,932 | B2 * | 7/2012 | Demirkan | H03L 7/087 327/147 |
| 9,973,197 | B2 * | 5/2018 | Nakata | H03L 7/0893 |
| 10,819,349 | B2 * | 10/2020 | Ng | H03L 7/081 |
| 2003/0071668 | A1 * | 4/2003 | Starr | H03L 7/0893 327/157 |
| 2003/0085743 | A1 * | 5/2003 | Ullmann | H03L 7/0891 327/156 |

(Continued)

FOREIGN PATENT DOCUMENTS

| JP | 9-232949 A | 9/1997 |
|---|---|---|
| JP | 9-321617 A | 12/1997 |

(Continued)

OTHER PUBLICATIONS

International Search Report issued in PCT/JP2018/009265 (PCT/ISA/210), dated Jun. 5, 2018.

(Continued)

*Primary Examiner* — Adam D Houston
(74) *Attorney, Agent, or Firm* — Birch, Stewart, Kolasch & Birch, LLP

(57) ABSTRACT

A first pulse selector outputs an output signal of a variable frequency divider to phase frequency detectors in a time division manner. A second pulse selector outputs a reference signal from a reference signal source to the phase frequency detectors in a time division manner. Outputs of the phase frequency detectors are provided, respectively, for multiple disposed charge pump circuits.

7 Claims, 8 Drawing Sheets

(56) References Cited

U.S. PATENT DOCUMENTS

| | | | |
|---|---|---|---|
| 2005/0141662 A1* | 6/2005 | Sano | H03L 7/087 375/376 |
| 2009/0160565 A1* | 6/2009 | Kawamoto | H03L 7/1976 331/1 A |
| 2010/0054760 A1* | 3/2010 | Fukuda | H04B 10/69 398/202 |
| 2010/0259307 A1* | 10/2010 | Kondou | H03L 7/093 327/157 |
| 2013/0187692 A1* | 7/2013 | Chen | H03K 19/00369 327/157 |
| 2014/0184281 A1* | 7/2014 | Danny | H03L 7/18 327/115 |
| 2016/0006442 A1* | 1/2016 | Lahiri | H03L 7/089 327/157 |
| 2016/0211855 A1* | 7/2016 | Unruh | H04B 1/40 |
| 2019/0074842 A1* | 3/2019 | Sun | H03L 7/197 |
| 2020/0358448 A1* | 11/2020 | Tsutsumi | H03L 7/18 |

FOREIGN PATENT DOCUMENTS

| | | |
|---|---|---|
| JP | 2001-69000 A | 3/2001 |
| JP | 2001-177398 A | 6/2001 |

OTHER PUBLICATIONS

Tsutsumi et al., "A Low Noise Multi-PFD PLL with Timing Shift Circuit", IEEE International Microwave Symposium, 2012, pp. 1-3.

* cited by examiner

FIG. 2A REF
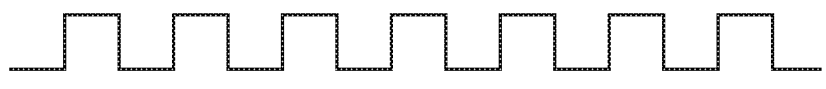
FIG. 2B Output of Variable Frequency Divider
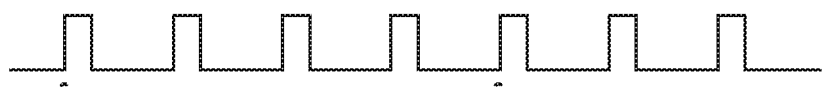
FIG. 2C Input to PFD 4a
FIG. 2D Input to PFD 4b
FIG. 2E Input to PFD 4c
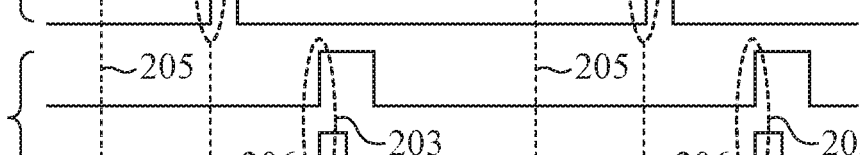
FIG. 2F Input to PFD 4d
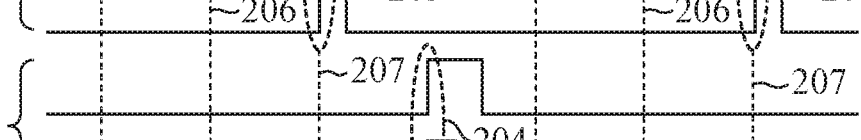
FIG. 2G Input Current to Loop Filter
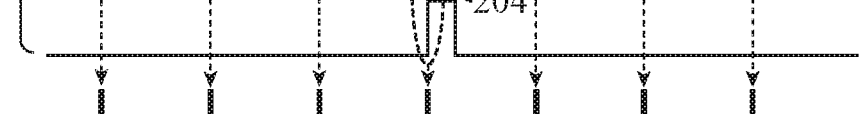
FIG. 3
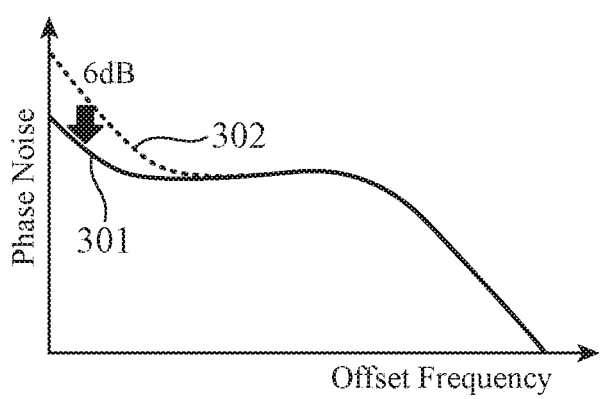

PLL CIRCUIT

CROSS REFERENCE TO RELATED APPLICATIONS

This application is a Continuation of PCT International Application No. PCT/JP2018/009265, filed on Mar. 9, 2018, which is hereby expressly incorporated by reference into the present application.

TECHNICAL FIELD

The present disclosure relates to a PLL circuit in which charge pump circuits are arranged in parallel.

BACKGROUND ART

A phase locked loop (PLL) circuit compares the phase of a signal acquired by performing frequency division on the output of a voltage control oscillator (VCO) and that of a reference signal and feeds a result of the comparison back to the frequency control voltage of the voltage control oscillator (referred to as the VCO hereinafter), thereby stabilizing the oscillating frequency of the VCO, and its output is used as a local oscillation wave for communication devices and radar devices. Because the phase noise characteristics of the PLL output have a great influence on the performance of communications and radar, it is desirable to make noise characteristics as low as possible.

Factors that determine the phase noise change depending on an offset frequency, and in a frequency range in which the offset frequency is high (frequencies approximately higher than a loop band), a noise in the VCO becomes dominant, whereas in a frequency range in which the offset frequency is low (frequencies approximately lower than the loop band), noises in a phase frequency detector (PFD), a charge pump circuit, a reference signal source, and so on become dominant.

As a method of reducing the phase noise in a frequency range in which the offset frequency is low (in the loop band), for example, there is a method of parallelizing a phase frequency detector and a charge pump, as disclosed by Patent Literature 1. This technique makes it possible to reduce the phase noise by 10 log m (dB) by, for example, providing a configuration in which two or more circuits are connected in parallel.

CITATION LIST

Patent Literature

Patent Literature 1: JP 2001-177398 A

SUMMARY OF INVENTION

Technical Problem

As mentioned above, in conventional PLL circuits, the noise in the loop band can be reduced by parallelizing the phase frequency detector and the charge pump. However, a problem is that the power consumption increases because of the parallelization of the circuits.

The present disclosure is made in order to solve the above-mentioned problem, and it is therefore an object of the present disclosure to provide a PLL circuit that makes it possible to reduce the phase noise while suppressing increase in the power consumption.

Solution to Problem

A PLL circuit according to the present disclosure includes: a voltage control oscillator to output a signal having a frequency corresponding to an applied voltage; a variable frequency divider to perform frequency division on the output signal of the voltage control oscillator; multiple phase frequency detectors each to receive an output signal from the variable frequency divider and a reference signal from a reference signal source, and to compare these signals; multiple charge pump circuits each to output a current corresponding to a signal that is a comparison result of a corresponding one of the multiple phase frequency detectors; a power control circuit to perform control to turn on power of each of the multiple phase frequency detectors and power of each of the multiple charge pump circuits in a time division manner; and a loop filter to combine output currents from the multiple charge pump circuits, and to output, as the applied voltage, a current-to-voltage-converted and smoothed signal to the voltage control oscillator.

Advantageous Effects of Invention

The PLL circuit of the present disclosure is configured in such a way that the parallelization of the phase frequency detectors and the charge pump circuits is implemented, and the signal of the variable frequency divider and the reference signal are provided for the multiple phase frequency detectors in a time division manner. As a result, a reduction in the phase noise can be achieved while increase in the power consumption is suppressed.

BRIEF DESCRIPTION OF DRAWINGS

FIGS. 2A to 2G are waveform charts at each unit, the charts showing the operations of the PLL circuit according to Embodiment 1 of the present disclosure;

FIG. 3 is an explanatory drawing showing a phase noise in the output of the PLL circuit according to Embodiment 1 of the present disclosure while making a comparison between the phase noise and that in a conventional PLL circuit;

DESCRIPTION OF EMBODIMENTS

Hereinafter, in order to explain the present disclosure in greater detail, embodiments of the present disclosure will be described with reference to the accompanying drawings.

Embodiment 1

Figure 1:
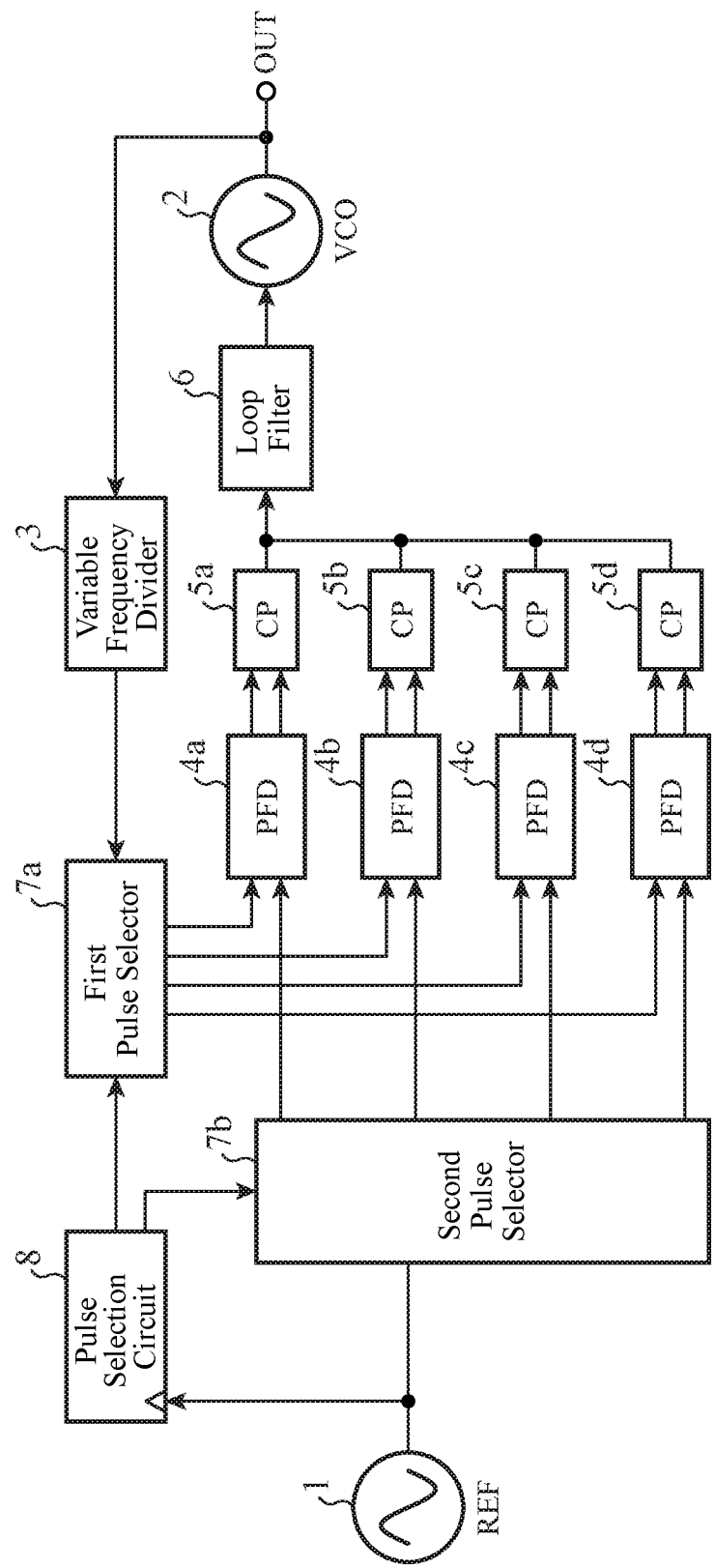
FIG. 1 is a block diagram showing a PLL circuit according to Embodiment 1 of the present disclosure.

FIG. 1 is a block diagram showing a PLL circuit according to this embodiment.

The PLL circuit shown in FIG. 1 includes a reference signal source (REF) 1, a voltage control oscillator (VCO) 2, a variable frequency divider 3, phase frequency detectors (PFDs) 4a to 4d, charge pump circuits 5a to 5d, a loop filter 6, a first pulse selector 7a, a second pulse selector 7b, and a pulse selection circuit 8. The reference signal source (referred to as the REF hereinafter) 1 generates a signal having a frequency that serves as a reference signal for the PLL circuit. The voltage control oscillator (referred to as the VCO hereinafter) 2 outputs a signal having a frequency corresponding to a voltage applied to a frequency control terminal, and is configured in such a way that its output is the output signal of the PLL circuit and is provided for the variable frequency divider 3. The variable frequency divider 3 receives the output of the VCO 2 and performs frequency division on the output at a division ratio controlled from the outside. Each of the PFDs 4a to 4d receives signals that are outputted in a time division manner from the first pulse selector 7a and the second pulse selector 7b, performs a phase comparison between the output signal of the first pulse selector 7a and the output signal of the second pulse selector 7b, and outputs a signal that is a result of the comparison to a corresponding one of the charge pump circuits 5a to 5d. The charge pump circuits 5a to 5d output currents corresponding to the signals outputted from the PFDs 4a to 4d, respectively, and these outputs are combined and provided for the loop filter 6. The loop filter 6 receives the outputs of the charge pump circuits 5a to 5d, and performs current-voltage conversion and smoothing on the outputs. The first pulse selector 7a receives the output signal of the variable frequency divider 3 and outputs the signal from each of output terminals for the PFDs 4a to 4d in a time division manner. The second pulse selector 7b receives the reference signal from the REF 1 and outputs the signal from each of output terminals for the PFDs 4a to 4d in a time division manner. The pulse selection circuit 8 outputs a selection control signal for pulse selecting processes that the first pulse selector 7a and the second pulse selector 7b perform, and performs control to cause these first and second pulse selectors 7a and 7b to output the time division signals destined for each of the PFDs 4a to 4d in order.

Next, the operations of the PLL circuit constructed as above will be explained.

The signal outputted from the VCO 2 that is also the output (OUT) of this PLL circuit is frequency-divided into parts by the variable frequency divider 3, and the parts pass through the first pulse selector 7a and are provided for the four PFDs 4a to 4d. On the other hand, the output of the REF 1 passes through the second pulse selector 7b and is provided for the four PFDs 4a to 4d, and the outputs of the PFDs 4a to 4d are provided, respectively, for the charge pump circuits 5a to 5d. The output currents of the charge pump circuits CP 5a to 5d are combined and are provided for the loop filter 6. In the loop filter 6, current-voltage conversion and smoothing (integration) are performed and a result is applied to the frequency control terminal of the VCO 2. Here, each of the first and second pulse selectors 7a and 7b outputs the inputted signal from a selected one of the four output terminals in accordance with an instruction from the pulse selection circuit 8 that operates with the signal, as a clock, from the REF 1.

Next, the operations of the PLL circuit of Embodiment 1 will be explained using a chart of a waveform at each unit. The waveform at each unit at the time of phase synchronization of this circuitry is shown in FIG. 2. In the figure, the output waveform of the REF 1 is shown in FIG. 2A, and the output waveform of the variable frequency divider 3 is shown in FIG. 2B.

First, the input signals to the PFD 4a are one signal extracted out of every four signals (every series of pulses) inputted to the first pulse selector 7a and one signal extracted out of every four signals (every series of pulses) inputted to the second pulse selector 7b (refer to FIG. 2C). Similarly, each input signal to the PFD 4b is one signal extracted out of every four signals (refer to FIG. 2D). Because each of these first and second pulse selectors 7a and 7b sequentially changes the terminal via which to output the signal among the four terminals, the signals are inputted to one of the four PFDs 4a to 4d at a certain moment (refer to FIGS. 2C to 2F). Further, the first pulse selector 7a and the second pulse selector 7b output the signals to the same one of the PFDs 4a to 4d at the same timing (refer to broken line frames 201 to 204 in FIGS. 2C to 2F). In this example, each of the PFDs 4a to 4d performs a comparison between the rising edges of the two signals inputted and outputs a result of the comparison to the corresponding one of the charge pump circuits 5a to 5d, and each of the charge pump circuits 5a to 5d outputs a current corresponding to the phase comparison result. Although each of the charge pump circuits 5a to 5d outputs the current that is the comparison result only once every four times, as shown in FIG. 2, the current (=the input current to the loop filter 6) into which the outputs of the four charge pump circuits 5a to 5d are combined is a series of pulses that are outputted at intervals of the period of the REF 1 in the same way of a configuration in which no parallelization is implemented (refer to broken line arrows 205 to 208 in FIGS. 2C to 2G).

Here, as to the noises in the output currents of the charge pump circuits, the noises being linked directly to the phase noise in the PLL output, an effect in the case of the parallelization of the circuits is considered. As to noises in a thermal noise region, because the noises have no correlation on the time axis, the noise included in the output current in the case in which no parallelization is implemented and current pulses are outputted at all times from the same circuit is the same as that included in the output current in the case in which the different circuits are arranged in parallel and current pulses outputted in order from the circuits are combined. In contrast with this, as to noises having frequency dependence, such as 1/f noises, as long as the frequency range is sufficiently lower than the sampling frequency, the noises in pulses close to each other in time have a high correlation in the case in which no parallelization is implemented and current pulses are outputted at all times from the same circuit. On the other hand, because the noises in the current pulses outputted from the different circuits arranged in parallel have a low correlation, in the case in which the current pulses outputted in order from the circuits are combined, the correlation between the noises in the current pulses is reduced and the noise can be reduced as compared with the case in which no parallelization is implemented. Therefore, by reducing the noise in the output current of the charge pump circuits, the phase noise in the PLL output can be reduced. An illustration of the output noise caused by this circuitry is shown in FIG. 3. The vertical axis shows the phase noise and the horizontal axis shows an offset frequency, and a characteristic 301 shown by a solid line is one in the configuration with parallelization of this embodiment and a characteristic 302 shown by a broken line is one in a configuration without parallelization.

As can be seen from FIG. 3, at the phase comparison frequency and in a low offset frequency region in which the 1/f noises in the charge pumps are dominant, in the case of the PLL having this configuration in which the four circuits are arranged in parallel, the phase noise in the 1/f noise region can be reduced by 6 dB as compared with the case in which no parallelization is implemented. In contrast, at the phase comparison frequency and in a flat noise region in which the thermal noises in the charge pumps are dominant, the parallelization does not cause any change in the noise value. In Embodiment 1, while the parallelization of the four circuits is implemented, since the time for which each circuit operates is ¼ of that before the penalization, the feature of the configuration is that the total power consumption in the PLL circuit is almost the same except for the electric power which is needed by the first pulse selector 7a, the second pulse selector 7b, and the pulse selection circuit 8.

Although in this embodiment the configuration in which the four PFDs 4a to 4d and the four charge pump circuits 5a to 5d are arranged in parallel is shown, the same advantage (however, the amount of noise reduction differs depending on the number of parallel circuits) is provided by arranging an arbitrary number of circuits in parallel, the number being two or more.

As mentioned above, in the PLL circuit of this embodiment, noises in a lower offset frequency region that is called a 1/f noise (flicker noise) region are suppressed. Particularly in circuits using CMOS transistors, there is a tendency for 1/f noises to become large as compared with circuits using bipolar junction transistors, and this embodiment is effective particularly for such a circuit.

As previously explained, the PLL circuit of Embodiment 1 includes: the voltage control oscillator for outputting a signal having a frequency corresponding to an applied voltage; the variable frequency divider for performing frequency division on the output signal of the voltage control oscillator; the first pulse selector for outputting an output signal of the variable frequency divider from the multiple output terminals in a time division manner; the second pulse selector for outputting the reference signal from the reference signal source from the multiple output terminals in a time division manner; the multiple phase frequency detectors each for receiving the signals outputted in a time division manner from the first pulse selector and the second pulse selector, and comparing the output signal of the first pulse selector and the output signal of the second pulse selector; the multiple charge pump circuits each for outputting a current corresponding to a signal that is a comparison result of the corresponding one of the multiple phase frequency detectors; and the loop filter for combining output currents from the multiple charge pump circuits, and outputting, as the applied voltage, a signal on which current-to-voltage conversion and smoothing are performed to the voltage control oscillator, a reduction in the phase noise can be achieved while increase in the power consumption is suppressed.

Embodiment 2

In Embodiment 2, the control of PFDs 4a to 4d and charge pump circuits 5a to 5d that are arranged in parallel is performed by a power control circuit.

Figure 4:
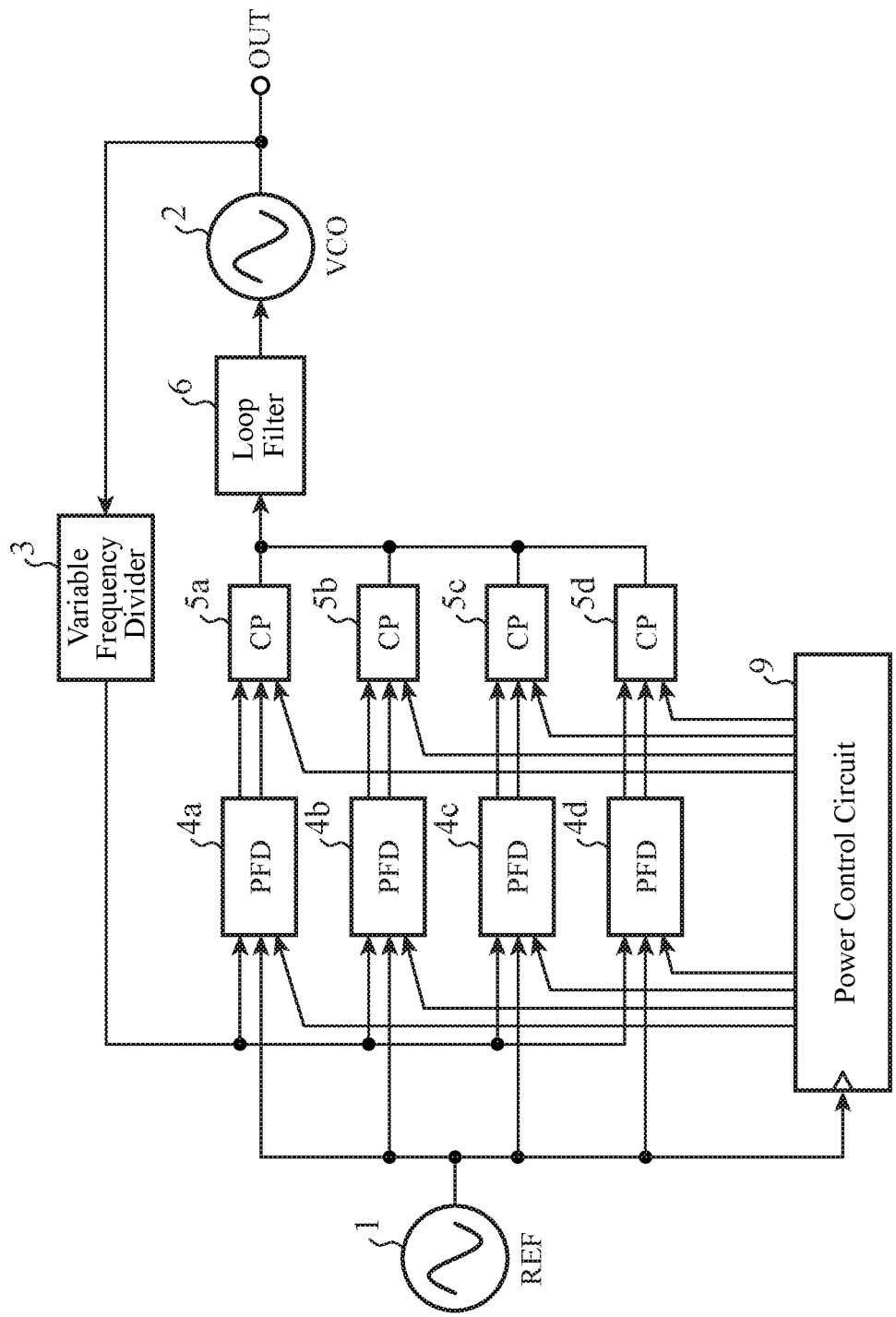
FIG. 4 is a block diagram showing a PLL circuit according to Embodiment 2 of the present disclosure.

The configuration of a PLL circuit of Embodiment 2 is shown in FIG. 4. The PLL circuit of Embodiment 2 includes a reference signal source (REF) 1, a voltage control oscillator (VCO) 2, a variable frequency divider 3, the phase frequency detectors (PFDs) 4a to 4d, the charge pump circuits 5a to 5d, a loop filter 6, and the power control circuit 9. Here, although the configuration in which the four PFDs 4a to 4d and the four charge pump circuits 5a to 5d are arranged in parallel is the same as that of Embodiment 1, a configuration in which signals to be provided for each of the PFDs 4a to 4d are inputted to all the PFDs 4a to 4d is provided, unlike in the case of Embodiment 1 in which the signals to be provided for each of the PFDs 4a to 4d are selected by the first pulse selector 7a, the second pulse selector 7b, and the pulse selection circuit 8. However, the power of each of the four PFDs 4a to 4d and the power of each of the four charge pump circuits 5a to 5d are controlled by the power control circuit 9 that operates with the REF 1 as a clock. More specifically, the power control circuit 9 is configured in such a way as to turn on the power of each of the PFDs 4a to 4d and the power of each of the charge pump circuits 5a to 5d in a time division manner on the basis of a reference signal from the REF 1.

Next, the operations of the PLL circuit according to Embodiment 2 will be explained.

Because a basic operation of the PLL circuit is the same as that of Embodiment 1, an operation different from the operations of Embodiment 1 will be explained.

Figure 5:
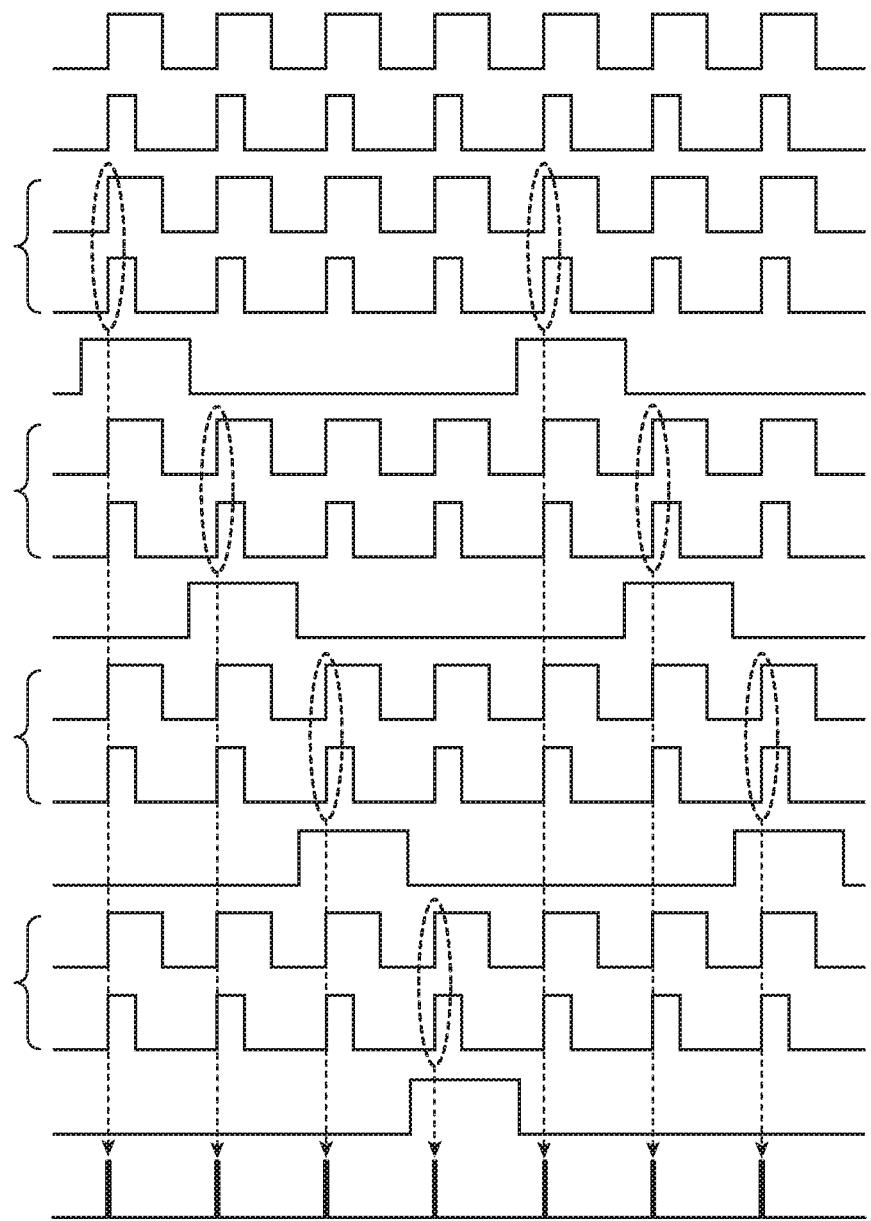
FIGS. 5A to 5K are waveform charts at each unit, the charts showing the operations of the PLL circuit according to Embodiment 2 of the present disclosure.

FIG. 5 is a waveform chart showing the operation of each unit of the PLL circuit of Embodiment 2. In the figure, the output waveform of the REF 1 is shown in FIG. 5A, and the output waveform of the variable frequency divider 3 is shown in FIG. 5B.

A power control signal to the PFD 4a is outputted from the power control circuit 9 in such a way as to cause the power of the PFD 4a to be in an on state only during a period of "High" and cause the power of the PFD 4a to be in an off state during a period of "Low" (refer to FIG. 5D). Further, although omitted in FIG. 5, the control of the power of the charge pump circuit 5a is performed in the same way. Each of control signals to the PFDs 4a to 4d and the charge pump circuits 5a to 5d that are outputted from the power control circuit 9 is in a "High" state only during one fourth of the entire period, and the four signals go "High" in order (refer to FIGS. 5D, 5F, 5H, and 5J). As a result, even though the signals are inputted to each of the PFDs 4a to 4d at all times (refer to FIGS. 5C, 5E, 5G, and 5I), an output current from the corresponding one of the charge pump circuits 5a to 5d is outputted only during a period during which the control signal is in a "High" state, i.e., only once every four times. Therefore, as shown in FIG. 5K, as an input current to the loop filter 6, the currents from the charge pump circuits 5a to 5d are outputted in order, and the same operations as those of the PLL circuit according to Embodiment 1 are performed and the same phase noise reduction advantage as that of Embodiment 1 is provided. Further, in Embodiment 2, because the desired operation can be implemented by using the single power control circuit 9 instead of the two pulse selectors: the first pulse selector 7a and the second pulse selector 7b, and the single pulse selection circuit 8 which are needed in Embodiment, a lower power consumption characteristic can be provided.

As previously explained, because the PLL circuit of Embodiment 2 includes: the voltage control oscillator for outputting a signal having a frequency corresponding to an applied voltage; the variable frequency divider for performing frequency division on the output signal of the voltage control oscillator; the multiple phase frequency detectors each for receiving an output signal from the variable frequency divider and the reference signal from the reference signal source, and comparing these signals; the multiple charge pump circuits each for outputting a current corresponding to a signal that is a comparison result of the corresponding one of the multiple phase frequency detectors; the power control circuit for performing control to turn on the power of each of the multiple phase frequency detectors and the power of each of the multiple charge pump circuits in a time division manner; and the loop filter for combining output currents from the multiple charge pump circuits, and outputting, as the applied voltage, a signal on which current-to-voltage conversion and smoothing are performed to the voltage control oscillator, a lower power consumption characteristic can be provided in addition to the advantage of Embodiment 1.

Embodiment 3

In Embodiment 3, parallelization of only charge pump circuits 5a to 5d is implemented in the circuitry of Embodiment 1.

Figure 6:
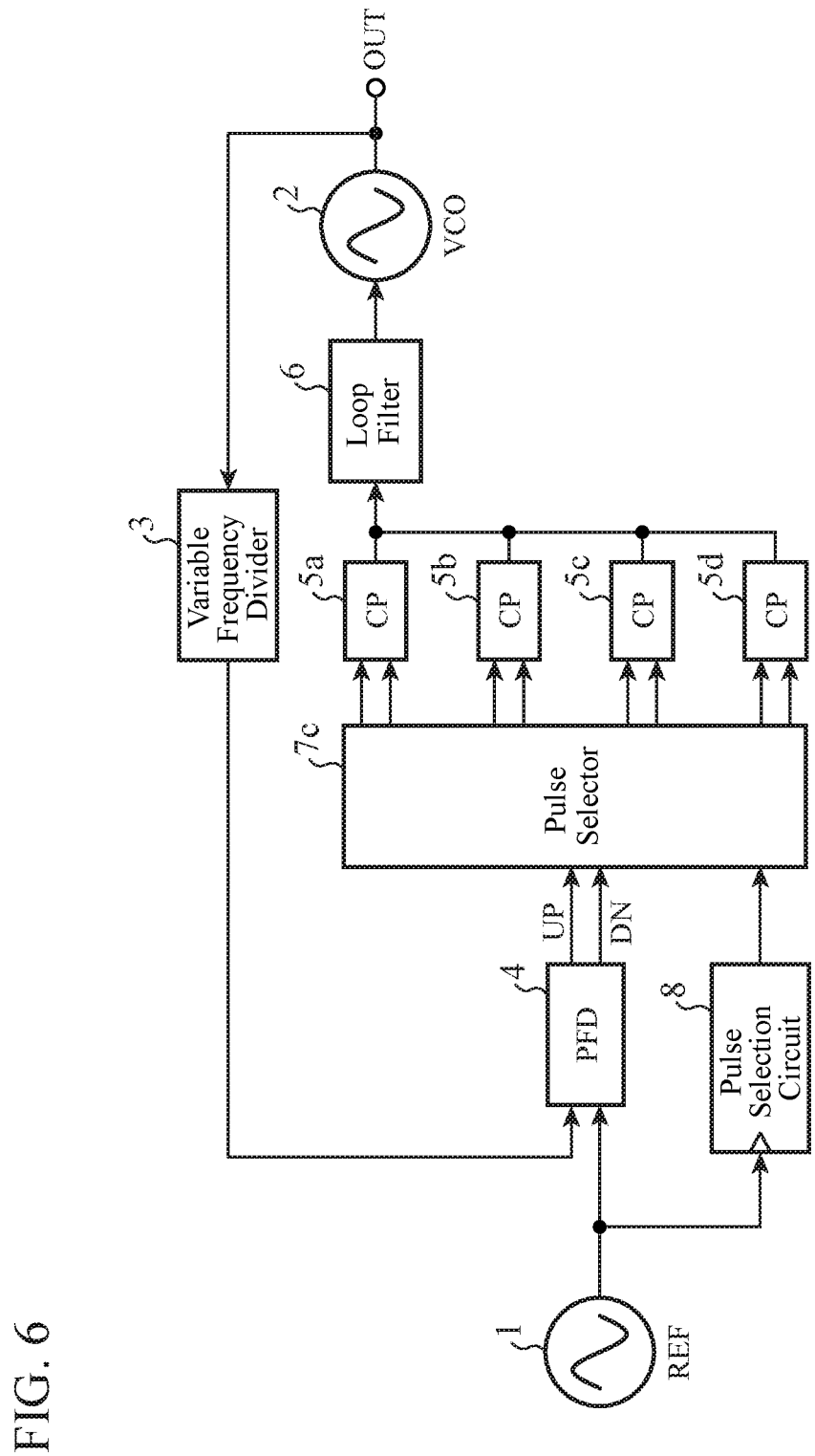
FIG. 6 is a schematic diagram showing a PLL circuit according to Embodiment 3 of the present disclosure.

The configuration of a PLL circuit of Embodiment 3 is shown in FIG. 6. The PLL circuit of Embodiment 3 includes a reference signal source (REF) 1, a voltage control oscillator (VCO) 2, a variable frequency divider 3, a phase frequency detector (PFD) 4, the charge pump circuits 5a to 5d, a loop filter 6, a pulse selector 7c, and a pulse selection circuit 8. The phase frequency detector (referred to as the PFD hereinafter) 4 receives an output signal of the variable frequency divider 3 and an output signal of the REF 1 and compares these signals, and outputs signals (an UP signal and a DN signal) showing a result of the comparison. The pulse selector 7c receives the signals outputted from the PFD 4, and outputs the signals to each of the charge pump circuits 5a to 5d in a time division manner on the basis of a selection control signal provided therefor from the pulse selection circuit 8. More specifically, the PLL circuit of Embodiment 3 is one in which parallelization of PFDs is not implemented, but parallelization of only the charge pump circuits 5a to 5d is implemented in the configuration of Embodiment 1.

Next, the operations of the PLL circuit according to Embodiment 3 will be explained.

Also in Embodiment 3, because a basic operation of the PLL circuit is the same as that of Embodiment 1, an operation different from the operations of Embodiment 1 will be explained.

Because the pulse selector 7c sequentially changes the terminal via which to output each of the signals among four terminals in a time division manner, the signals are inputted to one of the four charge pump circuits 5a to 5d at a certain moment. As a result, the current pulses inputted to the loop filter 6 are the same as those in the case in which no parallelization is implemented, but the charge pump circuit 5a, . . . , or 5d that is the output source differs for each pulse.

Therefore, although in the PLL circuit of Embodiment 3 the reduced phase noise in a 1/f noise region is only a component resulting from the charge pump circuits 5a to 5d, an advantage of reducing the noise is provided sufficiently. Further, because a smaller number of phase frequency detectors and a smaller number of pulse selectors are sufficient compared with those of Embodiment 1, the size and the power consumption of the entire circuitry can be suppressed.

As previously explained, in the PLL circuit of Embodiment 3, because the multiple phase frequency detectors are replaced by the single phase frequency detector and the first pulse selector and the second pulse selector are replaced by the pulse selector, and the pulse selector receives the output from the phase frequency detector and provides the output of the phase frequency detector for each of the multiple charge pump circuits in a time division manner, a reduction in the phase noise can be achieved while increase in the power consumption is suppressed. Further, the size and the power consumption of the entire circuitry can be suppressed in comparison with those in the configuration of Embodiment 1.

Embodiment 4

In Embodiment 4, parallelization of only charge pump circuits 5a to 5d is implemented in the circuitry of Embodiment 2.

Figure 7:
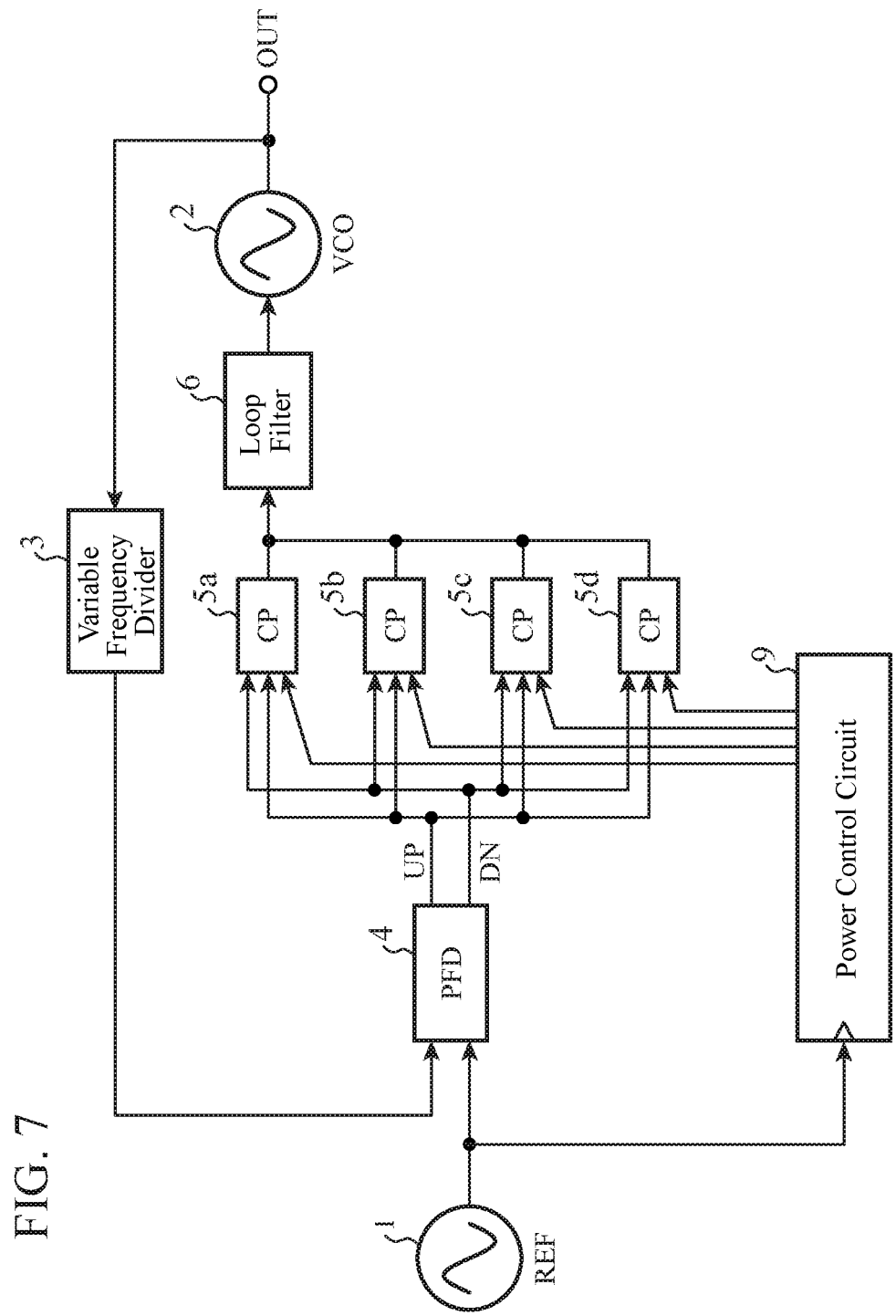
FIG. 7 is a block diagram showing a PLL circuit according to Embodiment 4 of the present disclosure.

The configuration of a PLL circuit of Embodiment 4 is shown in FIG. 7. The PLL circuit of Embodiment 4 includes a reference signal source (REF) 1, a voltage control oscillator (VCO) 2, a variable frequency divider 3, a phase frequency detector (PFD) 4, the charge pump circuits 5a to 5d, a loop filter 6, and a power control circuit 9. Here, the PFD 4 receives an output signal of the variable frequency divider 3 and an output signal of the REF 1 and compares these signals, and outputs signals (an UP signal and a DN signal) showing a result of the comparison, like the PFD 4 of Embodiment 3 shown in FIG. 6. The power control circuit 9 is configured in such a way as to turn on the power of each of the charge pump circuits 5a to 5d in a time division manner on the basis of a reference signal from the REF 1, like the power control circuit 9 of Embodiment 2 shown in FIG. 4. However, because in Embodiment 4 the number of PFDs 4 is only one, only the control of the power of each of the charge pump circuits 5a to 5d is performed. Another configuration is the same as that of Embodiment 2 shown in FIG. 4.

Next, the operations of the PLL circuit of Embodiment 4 will be explained.

The output from the variable frequency divider 3 and the signal from the REF 1 are inputted to the PFD 4. The output signals (the two signals including the UP signal and the DN signal) from the PFD 4 are caused to branch into four parts, and these parts are provided for the four charge pump circuits 5a to 5d arranged in parallel. The outputs of these charge pump circuits 5a to 5d are combined and provided for the loop filter 6.

The principle behind the operation of the power control circuit 9 is the same as that of Embodiment 2, and the power control circuit operates with the reference signal of the REF 1 as a clock and performs on/off control on the power of each of the four charge pump circuits 5a to 5d in order. As a result, the power of only one of the four charge pump circuits 5a to 5d is turned on at a certain moment, and, as a result, the current pulses inputted to the loop filter 6 are the same as those in the case in which no parallelization is implemented, but the charge pump circuit 5a, . . . , or 5d that is the output source differs for each pulse.

Although in the PLL circuit of Embodiment 4 the reduced phase noise in a 1/f noise region is only a component resulting from the charge pump circuits 5a to 5d, an advantage of reducing the noise is provided sufficiently. Further, because a smaller number of PFDs and a smaller number of pulse selectors are sufficient compared with those of Embodiment 2, the size and the power consumption of the entire circuitry can be suppressed.

As previously explained, because in the PLL circuit of Embodiment 4 the multiple phase frequency detectors are replaced by the single phase frequency detector, and the power control circuit performs control to turn on the power of each of the multiple charge pump circuits in a time division manner, a reduction in the phase noise can be achieved while increase in the power consumption is suppressed. Further, the size and the power consumption of the entire circuitry can be suppressed in comparison with those in the configuration of Embodiment 1.

Embodiment 5

In Embodiment 5, two unit circuits as each of which the PFDs and the charge pump circuits in Embodiment 1 are grouped together are arranged in parallel.

Figure 8:
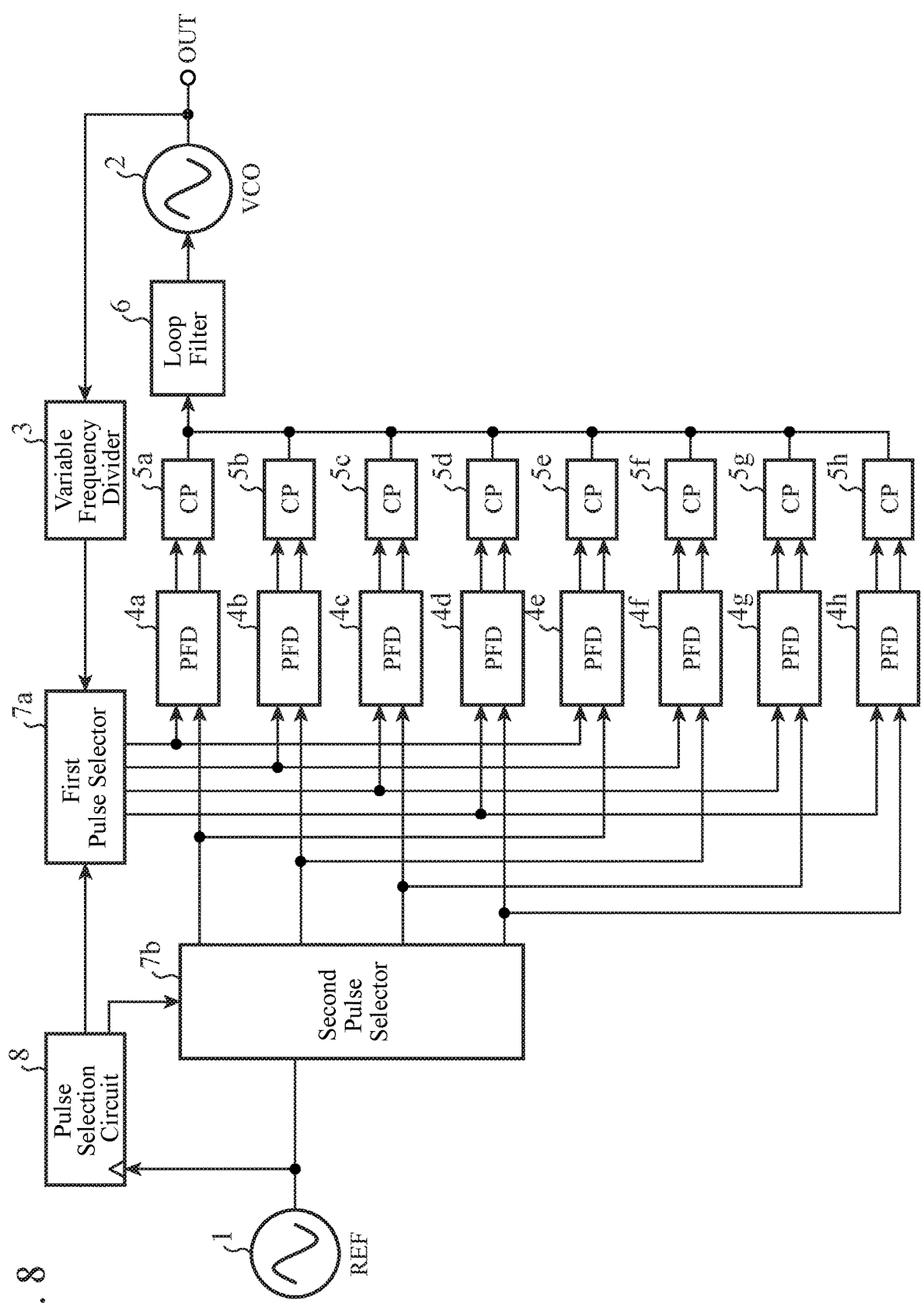
FIG. 8 is a block diagram showing a PLL circuit according to Embodiment 5 of the present disclosure.

FIG. 8 is a block diagram showing a PLL circuit of Embodiment 5. The PLL circuit of Embodiment 5 includes a reference signal source (REF) 1, a voltage control oscillator (VCO) 2, a variable frequency divider 3, the phase frequency detectors (PFDs) 4a to 4h, the charge pump circuits 5a to 5h, a loop filter 6, a first pulse selector 7a, a second pulse selector 7b, and a pulse selection circuit 8. Here, the PFDs 4a to 4d and the charge pump circuits 5a to 5d are the same as the PFDs 4a to 4d and the charge pump circuits 5a to 5d of Embodiment 1 which are shown in FIG. 1. The PFDs 4e to 4h and the charge pump circuits 5e to 5h receive the same inputs as those to the PFDs 4a to 4d, respectively. More specifically, the PFDs 4e to 4h and the charge pump circuits 5e to 5h are connected in parallel with the PFDs 4a to 4d and the charge pump circuits 5a to 5d. Another configuration is the same as that of Embodiment 1 shown in FIG. 1.

The operations of the PLL circuit of Embodiment 5 are the same as those of Embodiment 1 with the exception that the PFDs 4e to 4h and the charge pump circuits 5e to 5h operate in parallel with the PFDs 4a to 4d and the charge pump circuits 5a to 5d.

Figure 9:
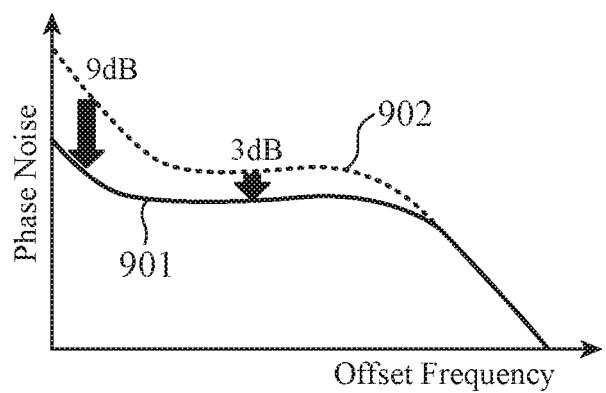
FIG. 9 is an explanatory drawing showing a phase noise in the output of the PLL circuit according to Embodiment 5 of the present disclosure while making a comparison between the phase noise and that in a conventional PLL circuit.

The PLL circuit of Embodiment 5 configured in this way provides both an effect (6 dB) of reducing the phase noise in a 1/f noise region, which is explained in Embodiment 1, and an effect (3 dB) of reducing the phase noise in a region within a loop band because of the parallelization of the entire circuitry into the two units. An illustration of the output noise caused by this circuitry is shown in FIG. 9. The vertical axis shows the phase noise and the horizontal axis shows an offset frequency, and a characteristic 901 shown by a solid line is one in the configuration with parallelization of this embodiment and a characteristic 902 shown by a broken line is one in the configuration without parallelization.

Although in the above-mentioned example the case in which the two unit circuits are arranged in parallel is shown, three or more unit circuits may be arranged in parallel. Further, although in the above-mentioned example the configuration in which multiple PFDs and multiple charge pump circuits are arranged in parallel in the configuration of Embodiment 1, multiple PFDs or a single PFD and multiple charge pump circuits may be similarly arranged in parallel also in the configurations of Embodiments 2 to 4.

As previously explained, because a PLL circuit of Embodiment 5 is configured in such a way that multiple unit circuits each in which multiple phase frequency detectors and multiple charge pump circuits are grouped together are connected in parallel in the PLL circuit of Embodiment 1 or 2, a further reduction in the phase noise can be achieved in addition to the advantage of Embodiment 1 or 2.

Further, because a PLL circuit of Embodiment 5 is configured in such a way that multiple unit circuits each in which a phase frequency detector and multiple charge pump circuits are grouped together are connected in parallel in the PLL circuit of Embodiment 3 or 4, a further reduction in the phase noise can be achieved in addition to the advantage of Embodiment 3 or 4.

It is to be understood that any combination of two or more of the above-mentioned embodiments can be made, various changes can be made in any component according to any one of the above-mentioned embodiments, and any component according to any one of the above-mentioned embodiments can be omitted within the scope of the present disclosure.

INDUSTRIAL APPLICABILITY

As mentioned above, the PLL circuit according to the present disclosure relates to a configuration for implementing a reduction in the power consumption and a reduction in the phase noise in the case in which parallelization of a charge pump circuit is implemented, and is effective particularly for, for example, cases of applying the PLL circuit to circuits using CMOS transistors.

REFERENCE SIGNS LIST

1: reference signal source (REF),
2: voltage control oscillator (VCO),
3: variable frequency divider,
4, 4a to 4h: phase frequency detector (PFD),
5a to 5h: charge pump circuit,
6: loop filter,
7a: first pulse selector,
7b: second pulse selector,
7c: pulse selector,
8: pulse selection circuit, and
9: power control circuit.

What is claimed is:

1. A PLL circuit comprising:
a voltage control oscillator to output a signal having a frequency corresponding to an applied voltage;
a variable frequency divider to perform frequency division on the output signal of the voltage control oscillator;
multiple phase frequency detectors each to receive the output signal from the variable frequency divider and the reference signal from the reference signal source, and to compare these signal;
multiple charge pump circuits each to output a current corresponding to a signal that is a comparison result of a corresponding one of the multiple phase frequency detectors, the multiple charge pump circuits being arranged in parallel with one another; and
a loop filter to combine output currents from the multiple charge pump circuits, and to output, as the applied voltage, a current-to-voltage-converted and smoothed signal to the voltage control oscillator, wherein
the PLL circuit further comprises a power control circuit to perform control to turn on power of each of the multiple phase frequency detectors and power of each of the multiple charge pump circuits in a time division manner.

2. A PLL circuit comprising:
a voltage control oscillator to output a signal having a frequency corresponding to an applied voltage;

a variable frequency divider to perform frequency division on the output signal of the voltage control oscillator;

a single phase frequency detector to receive the output signal of the variable frequency divider and the reference signal of the reference signal source, and to compare the output signal of the variable frequency divider and the reference signal of the reference signal source;

multiple charge pump circuits each to output a current corresponding to a signal that is a comparison result of the phase frequency detector, the multiple charge pump circuits being arranged in parallel with one another; and a loop filter to combine output currents from the multiple charge pump circuits, and to output, as the applied voltage, a current-to-voltage-converted and smoothed signal to the voltage control oscillator, wherein the PLL circuit further comprises a pulse selector to receive an output signal of the phase frequency detector, and to output signals from multiple output terminals thereof in a time division manner, and the current outputted by each of the multiple charge pump circuits corresponds to a signal that is a comparison result of the phase frequency detector in response to the signals outputted in the time division manner from the pulse selector.

3. A PLL circuit comprising:

a voltage control oscillator to output a signal having a frequency corresponding to an applied voltage;

a variable frequency divider to perform frequency division on the output signal of the voltage control oscillator;

a single phase frequency detector to receive the output signal of the variable frequency divider and the reference signal of the reference signal source, and to compare the output signal of the variable frequency divider and the reference signal of the reference signal source;

multiple charge pump circuits each to output a current corresponding to a signal that is a comparison result of the phase frequency detector, the multiple charge pump circuits being arranged in parallel with one another; and a loop filter to combine output currents from the multiple charge pump circuits, and to output, as the applied voltage, a current-to-voltage-converted and smoothed signal to the voltage control oscillator, wherein the PLL circuit further comprises a power control circuit that performs control to turn on the power of each of the multiple charge pump circuits in a time division manner, and the current outputted by each of the multiple charge pump circuits corresponds to a signal that is a comparison result of the phase frequency detector in response to the power being turned on by the power control circuit.

4. The PLL circuit according to claim 1, wherein multiple unit circuits each in which the multiple phase frequency detectors and the multiple charge pump circuits are grouped together are connected in parallel.

5. The PLL circuit according to claim 2, wherein multiple unit circuits each in which the phase frequency detector and the multiple charge pump circuits are grouped together are connected in parallel.

6. The PLL circuit according to claim 3, wherein multiple unit circuits each in which the phase frequency detector and the multiple charge pump circuits are grouped together are connected in parallel.

7. A PLL circuit comprising:

a voltage control oscillator to output a signal having a frequency corresponding to an applied voltage;

a variable frequency divider to perform frequency division on the output signal of the voltage control oscillator;

at least one phase frequency detector to receive an output signal from the variable frequency divider and a reference signal from a reference signal source, and to compare these signals;

multiple charge pump circuits each to output a current corresponding to a signal that is a comparison result of the at least one phase frequency detector, the multiple charge pump circuits being arranged in parallel with one another; and a loop filter to combine output currents from the multiple charge pump circuits, and to output, as the applied voltage, a current-to-voltage-converted and smoothed signal to the voltage control oscillator, wherein the PLL circuit includes at least one of:

a power control circuit configured to turn on power of the multiple charge pump circuits in a time division manner, and a pulse selector arranged between the at least one frequency detector and the multiple charge pump circuits, the pulse selector being configured to supply the output of the at least one phase frequency detector to the multiple charge pump circuits in a time division manner.

* * * * *